(12) United States Patent
Azadet

(10) Patent No.: US 9,813,223 B2
(45) Date of Patent: Nov. 7, 2017

(54) NON-LINEAR MODELING OF A PHYSICAL SYSTEM USING DIRECT OPTIMIZATION OF LOOK-UP TABLE VALUES

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 827 days.

(21) Appl. No.: 14/168,621

(22) Filed: Jan. 30, 2014

(65) Prior Publication Data
US 2014/0316752 A1 Oct. 23, 2014

Related U.S. Application Data

(60) Provisional application No. 61/812,858, filed on Apr. 17, 2013.

(51) Int. Cl.
*G06F 7/60* (2006.01)
*H04L 5/14* (2006.01)
(Continued)

(52) U.S. Cl.
CPC ........ *H04L 5/1461* (2013.01); *G06F 9/30036* (2013.01); *G06F 17/15* (2013.01);
(Continued)

(58) Field of Classification Search
CPC ..... H04L 5/1461; G06F 17/15; G06F 9/30036
(Continued)

(56) References Cited

U.S. PATENT DOCUMENTS 4,884,265 A 11/1989 Schroeder et al.
5,903,611 A 5/1999 Schnabl et al.
(Continued)

OTHER PUBLICATIONS

Kim et al. ("Digital predistortion of wideband signals based on power amplifier model with memory", IEEE, 2001).*
(Continued)

*Primary Examiner* — Omar Fernandez Rivas
*Assistant Examiner* — Iftekhar Khan
(74) *Attorney, Agent, or Firm* — Schwegman Lundberg & Woessner, P.A.

(57) ABSTRACT

Techniques for non-linear modeling of a physical system are provided using direct optimization of look-up table values. A non-linear system with memory is modeled by obtaining physical data for the non-linear system by applying a set of input samples x(n) to the non-linear system and measuring an output y(n) of the non-linear system; directly computing parameters Φ of a memory model for the non-linear system from the physical data, wherein the memory model comprises one or more look-up tables having linear interpolation and wherein the parameters Φ produce a substantially minimum mean square error; and providing the parameters Φ for storage as entries in the one or more look-up tables. The mean square error can be determined, for example, using one or more of a least squares algorithm, a least mean square algorithm and a recursive least squares algorithm. The look-up tables are optionally used in a processor instruction to implement digital pre-distortion.

16 Claims, 4 Drawing Sheets

(51) Int. Cl.
*H04L 25/08* (2006.01)
*G06F 17/50* (2006.01)
*H04B 1/62* (2006.01)
*H04L 1/00* (2006.01)
*H04B 1/04* (2006.01)
*G06F 17/15* (2006.01)
*G06F 9/30* (2006.01)
*H04L 25/03* (2006.01)
*H04L 27/36* (2006.01)
*H04J 11/00* (2006.01)
*H04B 1/525* (2015.01)

(52) U.S. Cl.
CPC .......... *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(58) Field of Classification Search
USPC .......................................................... 703/2
See application file for complete search history.

(56) References Cited

U.S. PATENT DOCUMENTS

| | | | |
|---|---|---|---|
| 6,298,097 B1 | 10/2001 | Shalom | |
| 6,496,609 B1 | 12/2002 | Walter | |
| 6,587,514 B1 | 7/2003 | Wright et al. | |
| 6,798,843 B1 | 9/2004 | Wright et al. | |
| 6,801,086 B1* | 10/2004 | Chandrasekaran | H03F 1/3247 330/140 |
| 7,058,369 B1* | 6/2006 | Wright | H01Q 1/243 375/297 |
| 7,242,725 B2 | 7/2007 | Matsumoto et al. | |
| 7,315,530 B2* | 1/2008 | Castelain | H04B 1/707 370/335 |
| 7,471,739 B1* | 12/2008 | Wright | H04L 27/368 330/149 |
| 7,924,942 B2* | 4/2011 | Rexberg | H03F 1/3247 375/296 |
| 8,331,509 B2 | 12/2012 | Wang et al. | |
| 8,498,591 B1* | 7/2013 | Qian | H04B 1/0475 375/297 |
| 9,225,501 B2 | 12/2015 | Azadet | |
| 2001/0050592 A1* | 12/2001 | Wright | H03F 1/3241 330/2 |
| 2002/0101938 A1* | 8/2002 | Horaguchi | H03F 1/3247 375/297 |
| 2002/0152248 A1 | 10/2002 | Bentz | |
| 2004/0001559 A1* | 1/2004 | Pinckley | H03F 1/3223 375/297 |
| 2004/0248516 A1 | 12/2004 | Demir et al. | |
| 2005/0116775 A1* | 6/2005 | McBeath | H03F 1/3241 330/149 |
| 2005/0136859 A1* | 6/2005 | Anvari | H04B 1/0475 455/114.3 |
| 2005/0140438 A1 | 6/2005 | Jin et al. | |
| 2005/0243946 A1 | 11/2005 | Chung et al. | |
| 2005/0253745 A1* | 11/2005 | Song | H03F 1/3247 341/118 |
| 2006/0240786 A1* | 10/2006 | Liu | H03F 1/3247 455/114.3 |
| 2007/0086134 A1 | 4/2007 | Zweigle et al. | |
| 2008/0008263 A1* | 1/2008 | Keerthi | H03F 1/0222 375/297 |
| 2008/0030388 A1* | 2/2008 | Muck | H03M 1/1235 341/138 |
| 2008/0123770 A1* | 5/2008 | Copeland | H03F 1/3247 375/285 |
| 2008/0133982 A1 | 6/2008 | Rawlins et al. | |
| 2008/0144539 A1* | 6/2008 | Sperlich | H04L 5/1469 370/278 |
| 2009/0051425 A1 | 2/2009 | Mehta et al. | |
| 2009/0051426 A1 | 2/2009 | Ba et al. | |
| 2009/0256632 A1* | 10/2009 | Klingberg | H03F 1/3241 330/149 |
| 2010/0105338 A1 | 4/2010 | Wang et al. | |
| 2010/0138463 A1 | 6/2010 | Azadet et al. | |
| 2010/0138464 A1* | 6/2010 | Azadet | G06F 1/035 708/290 |
| 2010/0138465 A1* | 6/2010 | Azadet | G06F 1/035 708/290 |
| 2010/0138468 A1* | 6/2010 | Azadet | G06F 9/3001 708/511 |
| 2010/0316157 A1 | 12/2010 | Bassam et al. | |
| 2011/0080216 A1* | 4/2011 | Mujica | H03F 1/3247 330/149 |
| 2011/0149714 A1 | 6/2011 | Rimini et al. | |
| 2011/0228828 A1 | 9/2011 | Wang et al. | |
| 2012/0269292 A1* | 10/2012 | Wang | H04B 1/0475 375/297 |
| 2012/0269293 A1 | 10/2012 | Peng et al. | |
| 2013/0162349 A1* | 6/2013 | Gao | H03F 1/3241 330/75 |
| 2013/0243123 A1 | 9/2013 | Bai | |
| 2013/0336377 A1 | 12/2013 | Liu et al. | |
| 2014/0086361 A1 | 3/2014 | Azadet et al. | |
| 2014/0218107 A1 | 8/2014 | Geng et al. | |
| 2014/0313946 A1 | 10/2014 | Azadet | |
| 2014/0314176 A1 | 10/2014 | Azadet | |
| 2014/0314181 A1 | 10/2014 | Azadet | |
| 2014/0317376 A1 | 10/2014 | Azadet | |

OTHER PUBLICATIONS

Pere Lluis Gilabert Pinal ("Multi Look-Up Table Digital Predistortion for RF Power Amplifier Linearization", Universitat Politecnica de Catalunya, 2007).*
"U.S. Appl. No. 14/230,607, Examiner Interview Summary dated Feb. 9, 2016", 3 pgs.
"U.S. Appl. No. 14/230,607, Final Office Action dated Jun. 2, 2016", 14 pgs.
"U.S. Appl. No. 14/230,607, Non Final Office Action dated Nov. 19, 2015", 15 pgs.
"U.S. Appl. No. 14/230,607, Response filed Feb. 19, 2016 to Non Final Office Action dated Nov. 19, 2015", 11 pgs.
"U.S. Appl. No. 14/230,622, Non Final Office Action dated Apr. 14, 2015", 22 pgs.
"U.S. Appl. No. 14/230,622, Notice of Allowance dated Aug. 28, 2015", 14 pgs.
"U.S. Appl. No. 14/230,622, Response filed Jul. 14, 2015 to Non Final Office Action dated Apr. 14, 2015", 14 pgs.
"U.S. Appl. No. 14/230,635, Advisory Action dated Nov. 15, 2016", 6 pgs.
"U.S. Appl. No. 14/230,635, Examiner Interview Summary dated Oct. 31, 2016", 3 pgs.
"U.S. Appl. No. 14/230,635, Final Office Action dated Jun. 30, 2016", 13 pgs.
"U.S. Appl. No. 14/230,635, Non Final Office Action dated Jan. 18, 2017", 14 pgs.
"U.S. Appl. No. 14/230,635, Non Final Office Action dated Dec. 4, 2015", 17 pgs.
"U.S. Appl. No. 14/230,635, Response filed Mar. 4, 2016 to Non Final Office Action dated Dec. 4, 2015", 11 pgs.
"U.S. Appl. No. 14/230,635, Response filed Oct. 31, 2016 to Final Office Action dated Jun. 30, 2016", 9 pgs.
"U.S. Appl. No. 14/230,635, Response filed Nov. 30, 2016 to Final Office Action dated Jun. 30, 2016", 9 pgs.
"U.S. Appl. No. 14/255,491, Final Office Action mailed Nov. 3, 2016", 14 pgs.
"U.S. Appl. No. 14/255,491, Non Final Office Action dated Jun. 16, 2016", 11 pgs.

(56) References Cited

OTHER PUBLICATIONS

"U.S. Appl. No. 14/255,491, Response filed Oct. 17, 2016 to Non Final Office Action dated Jun. 16, 2016", 11 pgs.

"Bilinear interpolation", Wikipedia, [Online] retrieved from the internet <https://web.archive.org/web/20110921104425/http://en.wikipedia.org/wiki/Bilinear_interpolation>, (Sep. 21, 2011).

Jin, Minglu, et al., "A fast LUT predistorter for power amplifier in OFDM systems", in Personal, Indoor and Mobile Radio Communications, 2003. PIMRC 2003. 14th IEEE Proceedings on, vol. 2, No., (Sep. 7-10, 2003), 1894-1897.

Li, Hao, et al., "A Fast Digital Predistoriton Algorithm for Radio-Frequency Power Amplifier Linearization With Loop Delay Compensation", in Selected Topics in Signal Processing, IEEE Journal of, vol. 3, No. 3, (Jun. 2009), 374-383.

Lu, Chao, et al., "A 24.7 dBm all-digital RF transmitter for multimode broadband application sin 40nm CMOS", in Solid-State Circuits Conference Digest of Technical Papers (ISSCC), 2013 IEEE International, vol., No., (Feb. 17-21, 2013), 332-333.

Nagata, Y, "Linear amplification technique for digital mobile communications", in Vehicular Technology Conference, 1989, IEEE 39th, vol.,No. 1, (May 1989), 159-164.

"U.S. Appl. No. 14/230,635, Response filed Apr. 18, 2017 to Non Final Office Action dated Jan. 18, 2017", 9 pgs.

"U.S. Appl. No. 14/255,491, Advisory Action dated Mar. 22, 2017", 4 pgs.

"U.S. Appl. No. 14/255,491, Response filed Apr. 11, 2017 to Advisory Action dated Mar. 22, 2017", 10 pgs.

\* cited by examiner

NON-LINEAR MODELING OF A PHYSICAL SYSTEM USING DIRECT OPTIMIZATION OF LOOK-UP TABLE VALUES

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

The present application is related to PCT Patent Application No. PCT/US12/62179, filed Oct. 26, 2012, entitled "Software Digital Front End (SoftDFE) Signal Processing;" and PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," each incorporated by reference herein.

FIELD OF THE INVENTION

The present invention is related to digital signal processing techniques and, more particularly, to techniques for modeling of non-linear systems.

BACKGROUND OF THE INVENTION

Digital pre-distortion (DPD) is a technique used to linearize a power amplifier in a transmitter to improve the efficiency of the power amplifier. A digital pre-distortion circuit inversely models the gain and phase characteristics of the power amplifier and, when combined with the amplifier, produces an overall system that is more linear and reduces distortion than would otherwise be caused by the power amplifier. An inverse distortion is introduced into the input of the amplifier, thereby reducing any non-linearity that the amplifier might otherwise exhibit.

PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications," discloses non-linear functions that include one or more parameters specified by a user, such as filter coefficient values or values from a look-up table. The disclosed DPD techniques are based on a generalized memory polynomial (GMP) model and implemented using look-up tables. Polynomial models, however, do not provide adequate performance for a number of common situations. For example, polynomial models do not capture functions that have discontinuities in them (such as a discontinuity of amplitude or derivative, or a higher order derivative).

While polynomial models have significantly improved the performance of software implementations of DPD and other non-linear applications, a need remains for improved techniques for modeling non-linear systems with discontinuities of amplitude, derivative or higher order derivatives.

SUMMARY OF THE INVENTION

Generally, improved techniques are provided for non-linear modeling of a physical system using direct optimization of look-up table values. According to one aspect of the invention, a non-linear system with memory is modeled by obtaining physical data for the non-linear system by applying a set of input samples x(n) to the non-linear system and measuring an output y(n) of the non-linear system; directly computing parameters $\Phi$ of a memory model for the non-linear system from the physical data, wherein the memory model comprises one or more look-up tables having linear interpolation and wherein the parameters $\Phi$ produce a substantially minimum mean square error; and providing the parameters $\Phi$ for storage as entries in the one or more look-up tables.

In various embodiments, the mean square error can be determined, for example, using one or more of a least squares algorithm, a least mean square algorithm and a recursive least squares algorithm. The memory model comprises, for example, one or more of a memory polynomial model and a generalized memory polynomial model, where one or more polynomials are replaced with one or more of the look-up tables having linear interpolation, and where the entries in the one or more look-up tables are directly calculated. The look-up tables are optionally used in a processor instruction to implement digital pre-distortion.

A more complete understanding of the present invention, as well as further features and advantages of the present invention, will be obtained by reference to the following detailed description and drawings.

DETAILED DESCRIPTION

Aspects of the present invention provide improved techniques for modeling non-linear systems, such as a DPD system or a power amplifier. According to one aspect of the invention, a physical system, such as a DPD system, is modeled using a non-linear model with direct optimization of look-up table values. In one exemplary embodiment, the input and output data of a physical system are used, for example, using a mean-square error approach, to directly determine the values that are stored in the exemplary look-up tables that implement the non-linear model.

Existing DPD techniques are typically based on a generalized memory polynomial (GMP) model and are implemented using look-up tables. GMP itself models an ideal Voterra series. GMP models an actual physical system such as a reverse power amplifier response (i.e., output to input response). The look-up tables are obtained by first computing the coefficients of each of the GMP polynomials using conventional techniques (e.g., a least squares approach) and then sampling each of the polynomials to create the look-up tables for each polynomial. This can be considered modeling a model, or approximating an approximation. The look-up tables approximate the GMP polynomial model, which is itself an approximation of an ideal infinite tap Volterra-based pre-distorter.

Aspects of the present invention recognize that polynomial models do not work well over an extended interval of input signal and do not work well in the presence of a discontinuity (e.g., a derivative discontinuity). In addition, aspects of the present invention recognize that look-up tables will perform better in these cases.

Thus, aspects of the present invention provide a non-linear model with look-up tables, where the values for the look-up tables are directly optimized from the physical data.

Figure 1:
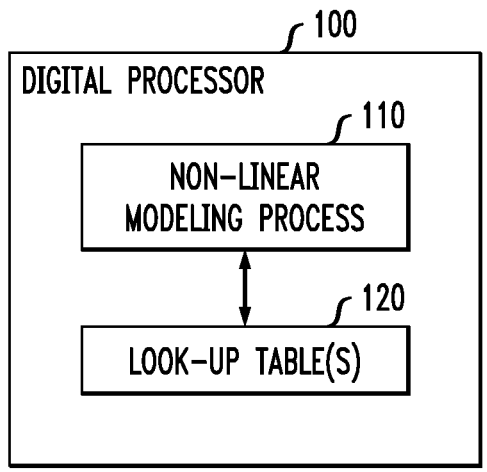
FIG. 1 is a schematic block diagram of an exemplary digital processor that incorporates features of the present invention.

FIG. 1 is a schematic block diagram of an exemplary digital processor 100 that incorporates features of the present invention. The exemplary digital processor 100 can be implemented as a DSP or a vector processor. As shown in FIG. 1, the exemplary digital processor 100 includes a non-linear modeling process 110, as discussed further below in conjunction with FIG. 2, for optimizing physical data, for example, using a mean-square error approach, to determine the values to be stored in one or more exemplary look-up tables 120 that implement the non-linear model.

The disclosed digital processors 100 may have a scalar architecture that processes a single number at a time, or a vector architecture that processes one or more numbers simultaneously. In the case of a vector-based digital processor implementation, the input number is a vector comprised of a plurality of scalar numbers that are processed in parallel.

Figure 2:
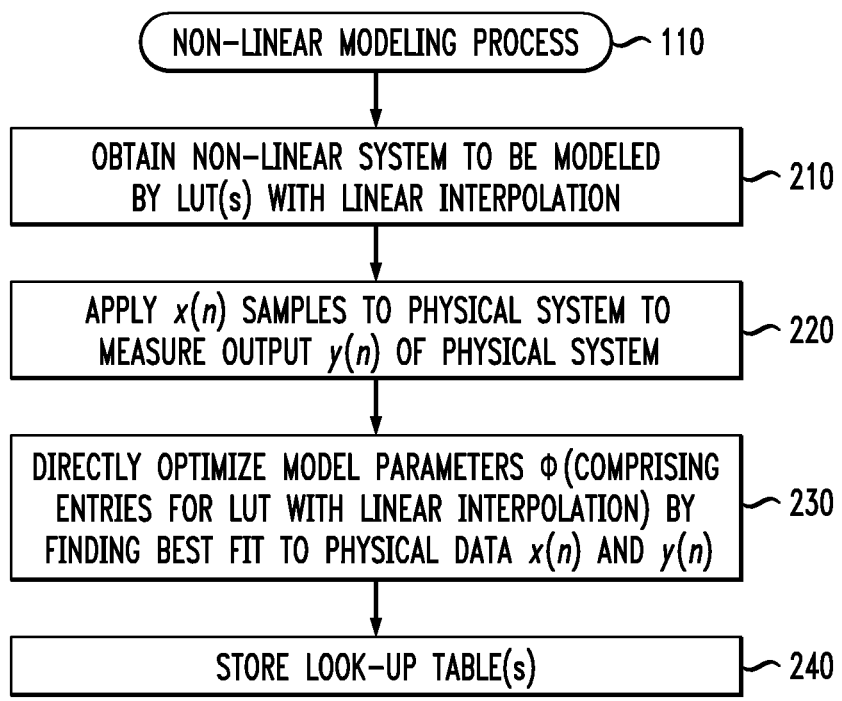
FIG. 2 is a flow chart illustrating an exemplary implementation of the non-linear modeling process of FIG. 1 incorporating aspects of the present invention.

FIG. 2 is a flow chart illustrating an exemplary implementation of the non-linear modeling process 110 of FIG. 1 incorporating aspects of the present invention. As shown in FIG. 2, the exemplary non-linear modeling process 110 initially obtains the non-linear system (real) to be modeled in accordance aspects of the invention during step 210. The model comprises a LUT with linear interpolation. The non-linear system is defined by an unknown non-linear function $f(x)$, similar to the functions described in PCT Patent Application No. PCT/US12/62186, filed Oct. 26, 2012, entitled "Processor Having Instruction Set with User-Defined Non-Linear Functions for Digital Pre-Distortion (DPD) and Other Non-Linear Applications:"

$$f(x)=y.$$

The function $f(x)$ is thus an unknown function defining the response of the actual physical system to be modeled, such as a reverse power amplifier response. Aspects of the present invention model the response $f(x)$ of the actual physical system using a model $\hat{f}(x)$ and estimate the parameters (LUT entries) of this model $\hat{f}(x)$ by performing direct optimization using the physical data.

As discussed hereinafter, the parameters (LUT entries) of the model $\hat{f}(x)$ are obtained using measured data $x(n)$ and $y(n)$. For example, to model the response of a power amplifier, $x(n)$ is used as the input of the power amplifier and $y(n)$ is used as the output of the power amplifier. Likewise, to model the inverse response of the power amplifier (a conceptual system or black box that has as its input the power amplifier output and as its output the power amplifier input), $x(n)$ is used as the output of the power amplifier, and $y(n)$ is used as the input of the power amplifier.

Thus, the non-linear modeling process 110 applies the input samples $x(n)$ to the physical system to measure a set of N output samples $y(n)$ ($n=0$ to $N-1$) during step 220 to obtain the physical data for the system:

$$f(x_n)=y_n$$

The non-linear modeling process 110 then directly optimizes the parameters Φ for the model during step 230 to find the best fit for the measured physical data. Generally, as discussed further below, the best fit identifies the parameters that provide a substantially minimum value for a mean square error.

As discussed further below, the model parameters comprise the entries for the LUT(s) with linear interpolation, referred to as $\hat{f}(x)$ of $f(x)$. The LUTs with linear interpolation are then stored during step 240.

Static Model for Real Signals

Figure 3:
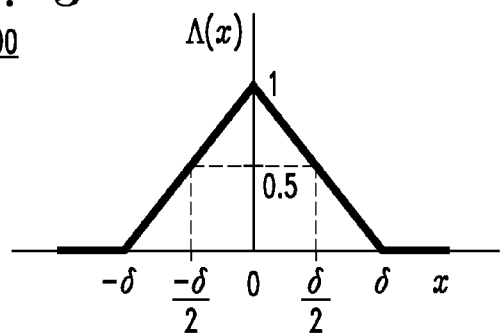
FIG. 3 illustrates a triangular basis function.

The LUT with linear interpolation of the function $f$ can be written as:

$$\hat{f}(x) = \sum_{p=0}^{P-1} f(p\delta)\Lambda(x - p\delta),$$

or, alternatively:

$$\hat{f}(x) = \sum_{p=0}^{P-1} \varphi_p \Lambda(x - p\delta)$$

where $\Lambda$ is the triangular basis function 300 shown in FIG. 3, and $\phi_p$ is the desired unknown look-up table entries.

The approximation error can be written as:

$$e_n = \hat{f}(x_n) - y_n$$

The following cost function is minimized:

$$C = \sum_{n=0}^{N-1} e_n^2 = \sum_{n=0}^{N-1} \left(\hat{f}(x_n) - y_n\right)^2$$

where:

$$u_{m,n} = \Lambda(x_n - m\delta),$$

and U is a matrix of size N×P with elements u, and Y is a N×1 column vector with elements y, and F is a P×1 vector of elements $\phi_p$.

U is of the form:

$$U = \begin{bmatrix} 0 & \cdots & 0 & u_0 & 1-u_0 & 0 & \cdots & 0 \\ 0 & u_1 & 1-u_1 & 0 & 0 & 0 & \cdots & 0 \\ \vdots & & & & & & & \vdots \\ 0 & 0 & \cdots & 0 & 0 & u_{N-1} & 1-u_{N-1} & 0 \end{bmatrix}$$

U has at most 2 (adjacent) non-zero elements per row, i.e. is very sparse. It has P columns and N rows. It may have only one element on the row corresponding to $|x_n|<d$ or $|x_n|>1-d$ (beyond the last point on the interval edge). Note unlike polynomial models, computation of U is low complexity as this matrix is very sparcse.

The optimization performed during step 230 comprises finding a minimum of the cost function, C, given by:

$$\Phi = (U^T U)^{-1} \cdot U^T Y$$

where Φ is a vector comprised of the model parameters comprising entries for the look-up tables and T indicates a Transpose matrix. It is noted that the function Φ is a function of the output Y and the matrix U which is itself a function of the input signal $x(n)$. This expression is for the case where x and y are real signals. The derivation for the complex case is discussed further below.

Because of the structure of U, $U^TU$ is tri-diagonal (diagonal, upper diagonal and lower diagonal). Among other benefits, inversion of a tri-diagonal matrix is relatively straightforward. Again, compared to computation of the auto-correlation matrix for polynomial models, this model involves very few Multiply/Accumulate (MAC) operations. For M=8 and N=$2^{18}$ and an example of $f(x)$:

$$U^TU = 10^4 \cdot \begin{bmatrix} 6.7440 & 1.3800 & 0 & 0 & 0 & 0 & 0 & 0 \\ 1.3800 & 4.1241 & 0.7139 & 0 & 0 & 0 & 0 & 0 \\ 0 & 0.7139 & 1.8512 & 0.2646 & 0 & 0 & 0 & 0 \\ 0 & 0 & 0.2646 & 0.6034 & 0.0721 & 0 & 0 & 0 \\ 0 & 0 & 0 & 0.0721 & 0.1384 & 0.0146 & 0 & 0 \\ 0 & 0 & 0 & 0 & 0.0146 & 0.0239 & 0.0019 & 0 \\ 0 & 0 & 0 & 0 & 0 & 0.0019 & 0.0027 & 0.0001 \\ 0 & 0 & 0 & 0 & 0 & 0 & 0.0001 & 0.0002 \end{bmatrix}$$

Figure 4A:
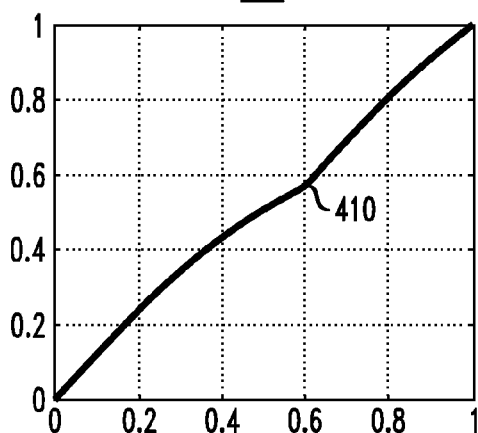
FIGS. 4A and 4B illustrate the optimization of entries for a look-up table in accordance with aspects of the invention.
Figure 4B:
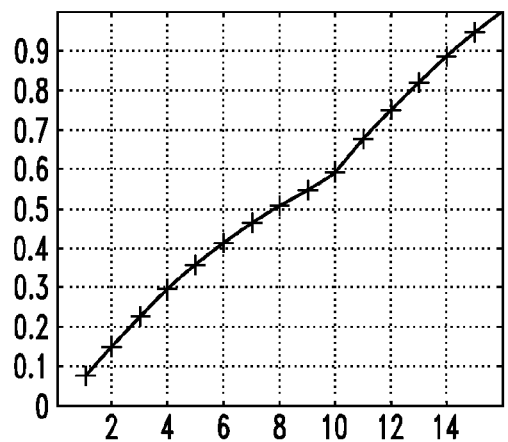

FIGS. 4A and 4B illustrate the optimization of entries for a look-up table in accordance with aspects of the invention. FIG. 4A illustrates an exemplary non-linear function having a derivative discontinuity 410. FIG. 4B illustrates the optimized values for the look-up table (e.g., a 16-point LUT) following an exemplary Least Squares optimization. Each point in FIG. 4B is a component of the vector Φ.

It can be shown that a relatively coarse 32-pt look-up table based on the exemplary non-linear function of FIGS. 4A and 4B has significantly lower approximation error compared to a polynomial model of order 19.

Figure 5A:
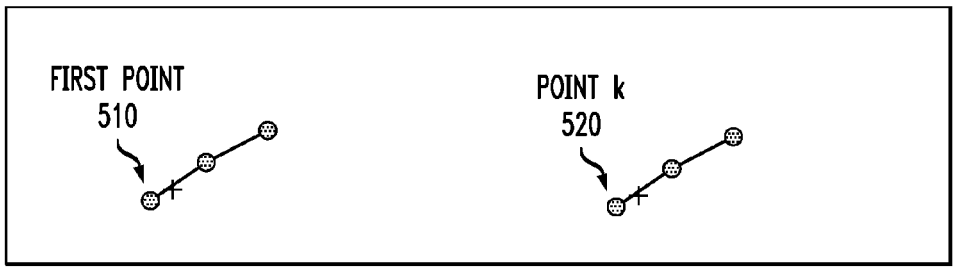
FIGS. 5A and 5B illustrates the interpolation for various exemplary points in a look-up table.

FIG. 5A illustrates an exemplary first point 510 in a look-up table, typically referred to as (0, 0), for |x/d|<=P-1, where x indicates the LUT input and d indicates the LUT step size (input amplitude quantization step).

For the exemplary first point 510, interpolation for a point between the first point 510 (0) and the second point (1) is performed using the next point in the look-up table, as follows:

y=LUT(0)*(1−abs(x/d−floor(x/d)))+LUT(1)*abs(x/d−floor(x/d)).

For the exemplary point k 520 in the look-up table, interpolation is performed using the point k and the next point k+1 in the look-up table, as follows:

y=LUT(k)*(1−abs(x/d−floor(x/d)))+LUT(k+1)*abs(x/d−floor(x/d)), where k=floor(x/d), k+1=floor(x/d)+1.

Figure 5B:
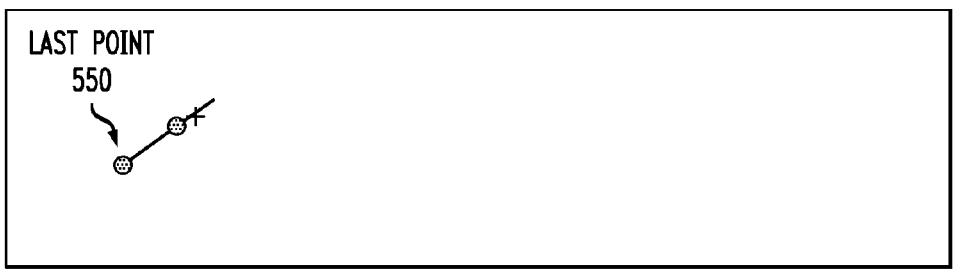

FIG. 5B illustrates an exemplary last point 550 in a look-up table, for |x/d|>P-1. Extrapolation for a point beyond the last point 500, the two previous points in the look-up table are used, as follows:

y=LUT(P-1)+(LUT(P-1)−LUT(P-2))/d*(x−d*floor(x/d))=−LUT(k)*abs(x/d−floor(x/d)+LUT(k+1)*(1+abs(x/d−floor(x/d)), where k=floor(x/d)−1, k+1=floor(x/d)

Figure 6A:
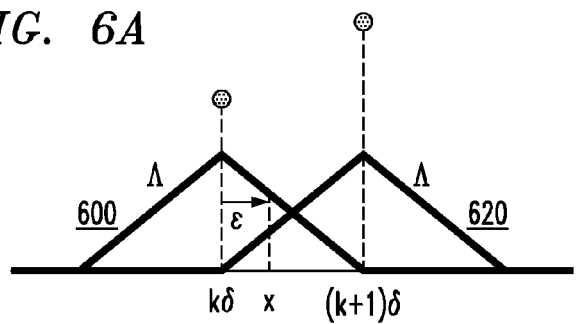
FIGS. 6A and 6B illustrate a change of the basis function of FIG. 3 using extrapolation.
Figure 6B:
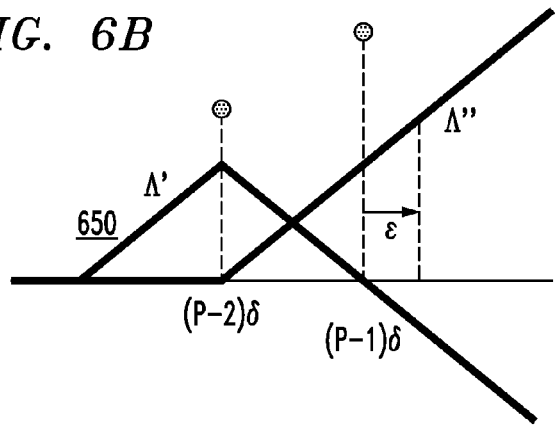

FIGS. 6A and 6B illustrate a change of the basis function 300 of FIG. 3 using extrapolation. For the basis functions 600, 620 shown in FIG. 6A, the interpolation for a point between two points k and k+1 in the look-up table can be expressed as follows:

$$y = LUT(k)*(1-\text{abs}(e/d)) + LUT(k+1)*\text{abs}(e/d)$$
$$= LUT(k)*L(x-kd) + LUT(k+1)*L(x-(k+1)d)$$

For the basis function 650 shown in FIG. 6B, the extrapolation for a point beyond the final two points P-1 and P-2 in the look-up table can be expressed as follows:

$$y = -LUT(P-2)*\text{abs}(e/d) + LUT(P-1)*(1+\text{abs}(e/d))$$
$$= LUT(P-2)*L'(x-(P-2)d) + LUT(P-1)*L''(x-(P-1)d)$$

Figure 7A:
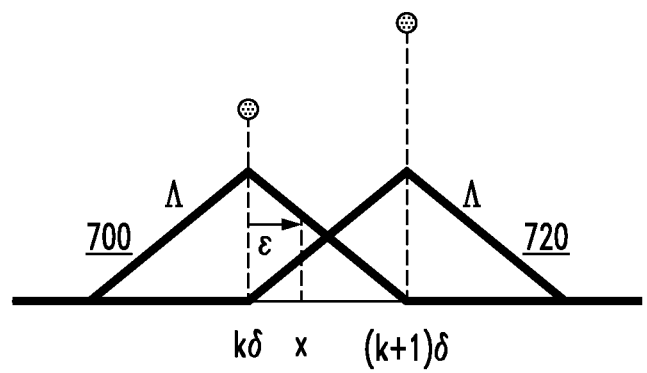
FIGS. 7A and 7B illustrate a change of the basis function of FIG. 3 using saturation.
Figure 7B:
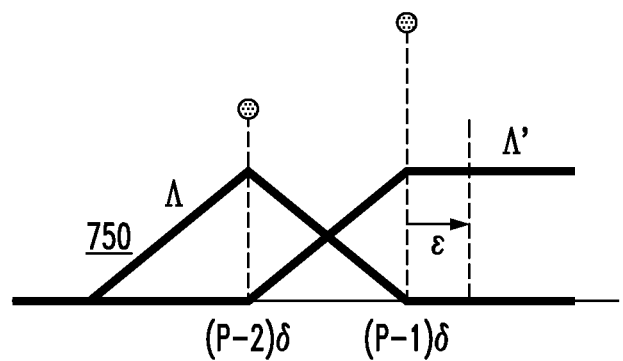

FIGS. 7A and 7B illustrate a change of the basis function 300 of FIG. 3 using saturation. For the basis functions 700, 720 shown in FIG. 7A, the interpolation for a point between two points k and k+1 in the look-up table can be expressed as follows (in a similar manner to FIG. 6A):

$$y = LUT(k)*(1-\text{abs}(e/d)) + LUT(k+1)*\text{abs}(e/d)$$
$$= LUT(k)*L(x-kd) + LUT(k+1)*L(x-(k+1)d).$$

For the basis function 750 shown in FIG. 7B, the extrapolation for a point beyond the final two points P-1 and P-2 in the look-up table can be expressed as follows:

$$y = -LUT(P-2)*0 + LUT(P-1)*1$$
$$= LUT(P-2)*L(x-(P-2)d) + LUT(P-1)*L'(x-(P-1)d).$$

LUT Optimization with Complex Signals

Static Model for Complex Signals

The previous section deals with estimation of parameters of an LUT modeling a real input/real output non-linear function. According to further aspects of the invention, LUT parameter modeling and parameter estimation can be extended to the more general case of non-linear systems with complex inputs and complex outputs using an AM-AM/AM-PM model:

y(n)=f(|x(n)|)x(n)

where the gain is signal dependent (i.e., a non-linear gain and phase relationship).

Thus, one difference with the previous model for real inputs/real outputs is that for complex inputs and outputs, f(|·|) appears as a non-linear gain, and not directly as the output amplitude. This model is referred to as Model G (G as in gain). The above described model is employed with complex values stored in the look-up table, as follows:

$$\hat{f}(x) = \sum_{p=0}^{P-1} \varphi_p \Lambda(x-p\delta)$$

The cost function is minimized as follows:

$$C = \sum_{n=0}^{N-1} e_n^2 = \sum_{n=0}^{N-1} (\hat{f}(|x_n|)x_n - y_n)^2.$$

Let $u_{m,n}=\Lambda(|x_n|-m\delta)$ and U be a matrix of size N×P with elements u, and Y be a N×1 column vector with elements y, and F be a P×1 vector of elements $\phi_p$. U is of the form:

$$U = \begin{bmatrix} 0 & \ldots & 0 & u_0 x_0 & (1-u_0)x_0 & 0 & \ldots & 0 \\ 0 & u_1 x_1 & (1-u_1)x_1 & 0 & 0 & 0 & \ldots & 0 \\ \vdots & & & & & & & \vdots \\ 0 & 0 & \ldots & 0 & 0 & u_{N-1}x_{N-1} & (1-u_{N-1})x_{N-1} & 0 \end{bmatrix}$$

U has at most two (adjacent) non-zero elements per row, i.e., U is very sparse. U has P columns and N rows. U may have only one element on the row corresponding to $|x_n|>1-d$ (beyond the last point on the interval edge). Note that unlike polynomial models, computation of U is of low complexity.

The minimum of C is again given by:

$$\Phi = (U^H U)^{-1} \cdot U^H Y$$

where $\Phi$ is a vector comprised of the entries for the look-up tables and H indicates a Hermitian matrix.

Due to the structure of U, $U^H U$ is still tri-diagonal (with diagonal, upper diagonal and lower diagonal entries). However, with this gain model, and contrary to the previous section (real/real case), $U^H U$ is ill conditioned.

The Gain model G has expressions of the form:

$$y = f(|x|)x$$

Hence:

$$|y| = |f(|x|)| \cdot |x|$$

If $|x|=|y|=0$, then $|f|_x|$ can have an arbitrary value, and this results in non-unique solutions where the first LUT value could be anything, still resulting in a good solution.

However, by normalizing this non-linear model (designated here as Model D, D as direct, <x> designates the argument of x):

$$y = f(|x|)e^{j<x>}$$

The following is obtained:

$$|y| = f(|x|)$$

In other words, when $|y|=0$, $|f|=0$, there is a unique solution.

Dynamic Memory Model for Complex Signals

The GMP model can be expressed as follows:

$$y(n) = \sum_{m=0}^{M-1} \sum_{l=0}^{M-1} \sum_{k=0}^{K-1} h_{k,m,l} |x(n-l)|^k x(n-m),$$

which can be rewritten as follows:

$$y(n) = \sum_{m=0}^{M-1} \sum_{l=0}^{M-1} x(n-m) \sum_{k=0}^{K-1} h_{k,m,l} |x(n-l)|^k$$

Let:

$$f_{m,l}(|x(n-l)|) = \sum_{k=0}^{K-1} h_{k,m,l} |x(n-l)|^k$$

The GMP model then becomes:

$$y(n) = \sum_{m=0}^{M-1} \sum_{l=0}^{M-1} x(n-m) \cdot f_{m,l}(|x(n-l)|)$$

The entries of look-up tables implementing these non-linear functions are then optimized, as follows:

$$\hat{f}_{m,l}(|x|) = \sum_{p=0}^{P-1} f_{m,l}(p\delta) \Lambda(|x|-p\delta) = \sum_{p=0}^{P-1} \varphi_{m,l,p} \Lambda(|x|-p\delta)$$

LUTs Implementing GMP

Let:

$$e_n = \hat{y} - y_n$$

Then, minimize the following cost function:

$$C = \sum_{n=0}^{N-1} |e_n|^2$$

Let $k=m+lM+pM^2$, and $K=M^2 N_{LUT}$, or more generally $K=N_{NL}N_{LUT}$ (e.g., if $N_{NL}=26$, number of LUT segments $N_{LUT}=16$, K=416 parameters to estimate) and:

$$u_{n,k} = \Lambda(|x_{n-l}|-p\delta)x(n-m)$$

Thus, a GMP with look-up tables can be expressed as follows:

$$\hat{y}(n) = \sum_{m=0}^{M-1} \sum_{l=0}^{M-1} \sum_{p=0}^{P-1} \varphi_{m,l,p} \Lambda(|x_{n-l}|-p\delta)x(n-m)$$

Although the matrix U is different than the static case described above, the optimization remains:

$$\Phi = (U^H U)^{-1} \cdot U^H Y$$

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method utilizing a modeling system for producing a digital pre-distortion processing device (PDPD) for a non-linear system, comprising:
   receiving, at an input of the modeling system, a physical electronic signal from said non-linear system by applying a set of input samples x(n) to said non-linear system and providing an output y(n) of said non-linear system as the physical electronic signal at the input of the modeling system;
   storing non-transitory information related to the physical electronic signal in a non-volatile memory of the modeling system;
   directly computing, utilizing a processor of the modeling system, parameters Φ of a non-linear system memory model for said non-linear system from the information related to said physical electronic signal, wherein said memory model comprises one or more look-up tables of said PDPD having linear interpolation and wherein said parameters Φ produce a substantially minimum mean square error; and
   producing said PDPD by writing, at an output of the modeling system, said parameters Φ for storage as entries in said one or more look-up tables to a memory of said PDPD to form the processor that provides digital pre-distortion in the non-linear system;
   wherein:
   said parameters Φ are computed using a tri-diagonal auto correlation matrix; and
   said directly computing of said parameters Φ to produce a substantially minimum mean square error comprises finding a minimum of a cost function given by:

$$\Phi = (U^T U)^{-1} \cdot U^T Y;$$

wherein:
   Φ is a vector comprised of model parameters comprising entries for the look-up tables;
   T indicates a Transpose matrix;
   U is of a form:

$$U = \begin{bmatrix} 0 & \cdots & 0 & u_0 & 1-u_0 & 0 & \cdots & 0 \\ 0 & u_1 & 1-u_1 & 0 & 0 & 0 & \cdots & 0 \\ \vdots & & & & & & & \vdots \\ 0 & 0 & \cdots & 0 & 0 & u_{N-1} & 1-u_{N-1} & 0 \end{bmatrix};$$

$u_{m,n} = \Lambda(X_n - m\delta)$;
   Λ is a triangular basis function;
   m is a row of U;
   n is a column of U; and
   $x_n$ is an output of said non-linear system, given $y_n$ as an input.

2. The method of claim 1, wherein said non-linear system has a memory length of zero.

3. The method of claim 1, wherein said memory model comprises a dynamic memory model.

4. The method of claim 1, wherein said non-linear system processes one or more of real signals and complex signals.

5. The method of claim 1, wherein said mean square error is determined using one or more of a least squares algorithm, a least mean square algorithm and a recursive least squares algorithm.

6. The method of claim 1, wherein said memory model comprises one or more of a memory polynomial model and a generalized memory polynomial model, where one or more polynomials are replaced with one or more of said look-up tables having linear interpolation, wherein said entries in said one or more look-up tables are directly calculated.

7. The method of claim 1, wherein said non-linear system comprises one or more of a power amplifier and an inverse of a power amplifier.

8. The method of claim 1, wherein said one or more look-up tables are used in a processor instruction to implement digital pre-distortion.

9. A modeling system apparatus for producing a digital pre-distortion processing device (PDPD) for a non-linear system, comprising:
   a non-volatile memory; and
   at least one hardware device, coupled to the memory, operative to:
   receive, at an input of the modeling system, a physical electronic signal from said non-linear system by applying a set of input samples x(n) to said non-linear system and providing an output y(n) of said non-linear system as the physical electronic signal at the input of the modeling system;
   store non-transitory information related to the physical electronic signal in the memory;
   directly compute parameters Φ of a non-linear system memory model for said non-linear system from the information related to said physical electronic signal, wherein said memory model comprises one or more look-up tables of said PDPD having linear interpolation and wherein said parameters Φ produce a substantially minimum mean square error; and
   produce the PDPD by a write, at an output of the modeling system, of said parameters Φ for storage as entries in said one or more look-up tables to a memory of said PDPD to form the processor that provides digital pre-distortion in the non-linear system;
   wherein said parameters Φ are computed using a tri-diagonal auto correlation matrix; and
   said directly computing of said parameters Φ to produce a substantially minimum mean square error comprises finding a minimum of a cost function given by:

$$\Phi = (U^T U)^{-1} \cdot U^T Y;$$

wherein:
   Φ is a vector comprised of model parameters comprising entries for the look-up tables;
   T indicates a Transpose matrix;
   U is of a form:

$$U = \begin{bmatrix} 0 & \cdots & 0 & u_0 & 1-u_0 & 0 & \cdots & 0 \\ 0 & u_1 & 1-u_1 & 0 & 0 & 0 & \cdots & 0 \\ \vdots & & & & & & & \vdots \\ 0 & 0 & \cdots & 0 & 0 & u_{N-1} & 1-u_{N-1} & 0 \end{bmatrix};$$

$u_{m,n} = \Lambda(X_n - m\delta)$;

$\Lambda$ is a triangular basis function;

m is a row of U;

n is a column of U; and $x_n$ is an output of said non-linear system, given $y_n$ as an input.

10. The apparatus of claim 9, wherein said non-linear system has a memory length of zero.

11. The apparatus of claim 9, wherein said memory model comprises a dynamic memory model.

12. The apparatus of claim 9, wherein said non-linear system processes one or more of real signals and complex signals.

13. The apparatus of claim 9, wherein said mean square error is determined using one or more of a least squares algorithm, a least mean square algorithm and a recursive least squares algorithm.

14. The apparatus of claim 9, wherein said memory model comprises one or more of a memory polynomial model and a generalized memory polynomial model, where one or more polynomials are replaced with one or more of said look-up tables having linear interpolation, wherein said entries in said one or more look-up tables are directly calculated.

15. The apparatus of claim 9, wherein said non-linear system comprises one or more of a power amplifier and an inverse of a power amplifier.

16. The apparatus of claim 9, wherein said one or more look-up tables are used in a processor instruction to implement digital pre-distortion.

* * * * *